US009696503B2

(12) United States Patent
Lin et al.

(10) Patent No.: US 9,696,503 B2
(45) Date of Patent: Jul. 4, 2017

(54) MULTI-CHANNEL TRANSMITTER OPTICAL SUBASSEMBLY (TOSA) WITH AN OPTICAL COUPLING RECEPTACLE PROVIDING AN OFF-CENTER FIBER

(71) Applicant: Applied Optoelectronics, Inc., Sugar Land, TX (US)

(72) Inventors: Kai-Sheng Lin, Sugar Land, TX (US); I-Lung Ho, Sugar Land, TX (US); Jun Zheng, Missouri City, TX (US); Chong Wang, Stafford, TX (US)

(73) Assignee: Applied Optoelectronics, Inc., Sugar Land, TX (US)

( * ) Notice: Subject to any disclaimer, the term of this patent is extended or adjusted under 35 U.S.C. 154(b) by 0 days.

(21) Appl. No.: 14/850,367

(22) Filed: Sep. 10, 2015

(65) Prior Publication Data
US 2017/0075079 A1 Mar. 16, 2017

(51) Int. Cl.
*H04B 10/40* (2013.01)
*G02B 6/42* (2006.01)
*G02B 6/32* (2006.01)
*H01S 5/00* (2006.01)

(52) U.S. Cl.
CPC ............ *G02B 6/4209* (2013.01); *G02B 6/32* (2013.01); *G02B 6/4228* (2013.01); *G02B 6/4263* (2013.01); *H01S 5/0078* (2013.01); *H04B 10/40* (2013.01)

(58) Field of Classification Search
None
See application file for complete search history.

(56) References Cited

U.S. PATENT DOCUMENTS 6,697,414 B1 2/2004 Kato et al.
2003/0081908 A1 5/2003 Gage et al.
(Continued)

FOREIGN PATENT DOCUMENTS

WO 2015013853 A1 2/2015

OTHER PUBLICATIONS

PCT Search Report and Written Opinion mailed Nov. 22, 2016, received in corresponding PCT Application No. PCT/US16/50401, 11 pgs.

*Primary Examiner* — Darren E Wolf
(74) *Attorney, Agent, or Firm* — Grossman Tucker Perreault & Pfleger, PLLC; Norman S. Kinsella (57) ABSTRACT

A multi-channel transmitter optical subassembly (TOSA) with an off-center fiber in an optical coupling is disclosed, and can provide passive compensation for beam displacement introduced by optical isolators. The optical coupling receptacle can include an optical isolator configured to receive a focused light beam from a focus lens within the TOSA. The optical coupling receptacle may be offset such that a center line of the focused light beam entering the optical isolator is offset from a center line of a fiber within optical coupling receptacle. Thus the optical isolator receives the focused light beam from the focus lens and introduces beam displacement such that an optical signal is launched generally along a center line of the fiber. Thus the expected beam displacement introduced by the optical isolator is eliminated or otherwise mitigated by the offset between a center line of the fiber and a center position of the focus lens.

20 Claims, 6 Drawing Sheets

(56) References Cited

U.S. PATENT DOCUMENTS

| | | | |
|---|---|---|---|
| 2005/0100263 A1* | 5/2005 | Shi | G02F 1/093 385/11 |
| 2005/0157976 A1 | 7/2005 | Furukawa et al. | |
| 2007/0154218 A1* | 7/2007 | Sommer | G02B 6/29365 398/85 |
| 2008/0085078 A1* | 4/2008 | Teo | G02B 6/4207 385/36 |
| 2013/0039660 A1 | 2/2013 | Ho et al. | |
| 2016/0047998 A1* | 2/2016 | Amirkiai | G02B 6/43 385/14 |
| 2016/0139351 A1* | 5/2016 | Okada | G02B 6/4225 385/33 |

* cited by examiner

MULTI-CHANNEL TRANSMITTER OPTICAL SUBASSEMBLY (TOSA) WITH AN OPTICAL COUPLING RECEPTACLE PROVIDING AN OFF-CENTER FIBER

CROSS-REFERENCE TO RELATED APPLICATIONS

This application is related to co-pending U.S. application Ser. No. 14/837,993 titled "Multi-Channel Transmitter Optical Subassembly (TOSA) With Opposing Placement of Transistor Outline Can Laser Packages" filed on Aug. 27, 2015, which is herein incorporated by reference in its entirety.

TECHNICAL FIELD

The present disclosure relates to optical transceiver modules, and more particularly, to a multi-channel transmitter optical subassembly (TOSA) configured to couple to and launch an optical signal into an off-center fiber in order to passively compensate for beam displacement introduced by an optical isolator.

BACKGROUND INFORMATION

Optical transceivers are used to transmit and receive optical signals for various applications including, without limitation, internet data center, cable TV broadband, and fiber to the home (FTTH) applications. Optical transceivers provide higher speeds and bandwidth over longer distances, for example, as compared to transmission over copper cables. The desire to provide higher speeds in smaller optical transceiver modules for a lower cost has presented challenges, for example, with respect to maintaining optical efficiency (power), thermal management, insertion loss, and manufacturing yield.

Optical transceiver modules generally include one or more transmitter optical subassemblies (TOSAs) for transmitting optical signals. One consideration in maintaining TOSA performance is backreflection of laser light. Backreflection can occur when, for example, laser energy incident to a laser cavity reflects back in the direction it originated from. To minimize or otherwise mitigate backreflection, TOSAs can include passive optics such as an optical isolator. Optical isolators allow the transmission of light in only one direction, and thus, prevent or otherwise mitigate backreflection.

BRIEF DESCRIPTION OF THE DRAWINGS

These and other features and advantages will be better understood by reading the following detailed description, taken together with the drawings wherein.

DETAILED DESCRIPTION

As previously discussed, multi-channel TOSAs can use optical isolators to reduce backreflection during optical signal transmission. However, optical isolators can introduce beam displacement (offset) such that the line of propagation in the forward direction of the optical isolator is off-axis from the light arriving at an input of the optical isolator. Even relatively small amounts of beam displacement, such as a few microns, can cause an appreciable reduction in optical power. Some approaches to TOSAs compensate for this through active compensation procedures after attachment of an optical coupling receptacle. For example, one approach includes fixedly attaching an optical coupling receptacle to the housing of a TOSA, and then compensating for beam displacement introduced by an optical isolator associated with the optical coupling receptacle through active post-attachment alignment of CAN laser packages.

In some cases, a beam can be titled to counteract the displacement introduced by the isolator. However, this also requires a proportional adjustment of associated filters within the TOSA housing to ensure that the filters maintain a 45 degree angle of incidence relative to the lasers. Active alignment of CAN laser packages using, for instance, laser hammering can be time consuming, error prone, and expensive to perform. The relatively small dimensions of small form factor (SFF) designs can further complicate such alignment and compensation. This can cause a reduction in yield during manufacturing of TOSAs.

Thus, in accordance with an embodiment, a multi-channel TOSA having an off-center fiber position in an optical coupling receptacle is disclosed, and can provide passive compensation for beam displacement introduced by optical isolators. In more detail, the optical coupling receptacle can include an optical isolator configured to receive a focused light beam from a focus lens within the multi-channel TOSA. The fiber may be positioned within the optical coupling receptacle at an offset such that a center line of the focused light beam entering the optical isolator is offset from a center line of a fiber. The center line of the focus light beam may be a function of the physical center of the lens. Thus it may also be accurate to describe the center line of the fiber as being offset from a physical center of the focus lens. However, it should be appreciated that some lenses have an optical center not necessarily in the physical center of the lines. In any event, this disclosure is equally applicable in either scenario, with minor modification, and should not be construed as limited in this regard.

In use, the optical isolator receives the focused light beam from the focus lens and introduces beam displacement such that an optical signal is launched generally along a center line of the fiber. In a general sense, the expected beam displacement introduced by the optical isolator is eliminated or otherwise mitigated by the offset of the center of the fiber relative to the center of the focus lens.

The offset between the center line of the fiber and the center of the focus lens may be provided by, for example, attaching the optical coupling receptacle to the multi-channel TOSA housing at a position offset from the center of the focus lens. In this example, a first sidewall opening may be formed on an end of the multi-channel TOSA housing, and configured to mount the focus lens. Next, a second sidewall opening may be formed on the end of the multi-channel housing and configured to mount an optical coupling receptacle. The second sidewall opening may be formed off-center from the first sidewall opening such that a center point of the second sidewall opening is offset along a Y axis from a center point of the first sidewall opening. The offset of the off-center optical coupling receptacle may be 10 to 100 microns relative to the center of the focus lens. Other offsets will be apparent in light of this disclosure and may be based on, for example, isolator type, a particular number of isolators employed, isolator thickness, and other isolator-specific factors.

In more detail, the multi-channel TOSA can include a plurality of TO can laser packages fixedly attached to one or more side walls of the multi-channel TOSA housing, and may also include an optical coupling receptacle fixedly attached or otherwise integrated into an end of the multi-channel TOSA housing. The multi-channel TOSA housing may include a compartment defined by an inner surface of the sidewalls, with the compartment providing a light path to optically couple each of the TO can laser packages thereto. The light path may extend laterally from a first end to a second end of the multi-channel TOSA housing along a first major axis. A focus lens disposed at the second end of the multi-channel TOSA housing may receive at least a portion of laser light via the light path, and output a focused light beam to an optical coupling receptacle which couples an optical signal to an associated transmit fiber. The optical coupling receptacle may include an optical isolator configured to receive the focused light beam and propagate the same in a forward direction to a fiber while reducing backreflection. The optical isolator may introduce beam displacement, with that displacement causing the optical isolator to propagate the focused beam generally along a center line of the fiber. Thus the optical coupling receptacle may include a center line which is generally offset from a center line of the focused light beam launched into the optical coupling receptacle.

The multi-channel TOSA with off-center fiber disclosed herein may provide numerous benefits and advantages over other multi-channel TOSA approaches that also include an optical isolator. For example, the multi-channel TOSA disclosed herein allows the attachment of an optical coupling receptacle to an end of the multi-channel TOSA without necessarily requiring a full active alignment process, or beam compensation through filter tilting, which characterizes other multi-channel TOSA approaches. In addition, the off-center fiber provides, in a sense, a built-in degree of coupling optimization such that a predetermined optical power may be achieved even prior to fine-grain and course active alignment procedures such as laser hammering of TO can laser packages.

As used herein, "channel wavelengths" refer to the wavelengths associated with optical channels and may include a specified wavelength band around a center wavelength. In one example, the channel wavelengths may be defined by an International Telecommunication (ITU) standard such as the ITU-T dense wavelength division multiplexing (DWDM) grid or course wavelength division multiplexing (CWDM). The term "coupled" as used herein refers to any connection, coupling, link or the like and "optically coupled" refers to coupling such that light from one element is imparted to another element. Such "coupled" devices are not necessarily directly connected to one another and may be separated by intermediate components or devices that may manipulate or modify such signals.

As used herein, "optical center" refers to the point on a principal axis of a lens for which the incident direction of a light ray passing through is parallel to the emergent direction. The optical center is not necessarily the physical center of a lens, and is instead a function of the composition and geometries of the particular lens.

Figure 1:
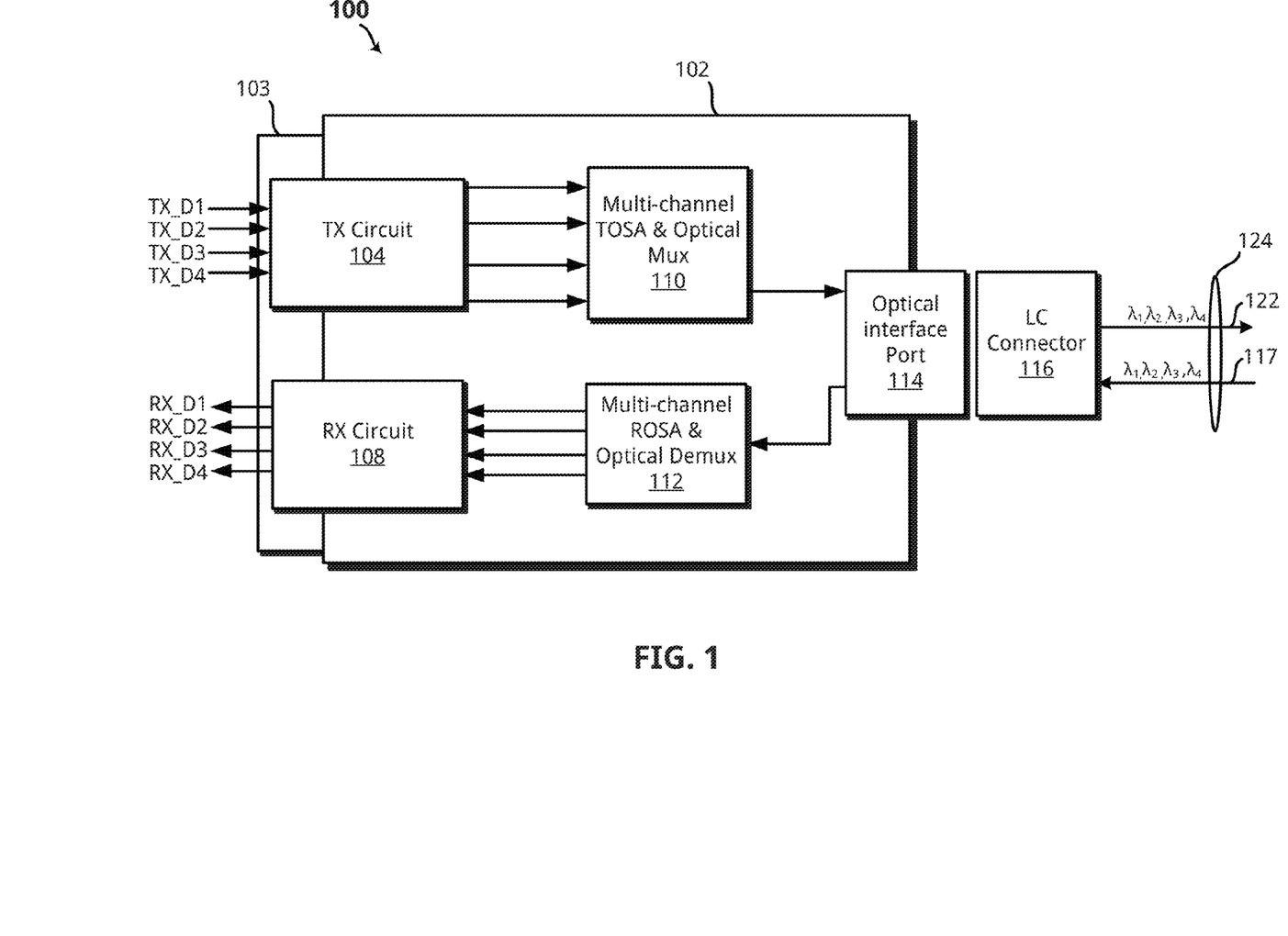
FIG. 1 schematically illustrates an embodiment of an optical transceiver module including a multi-channel transmitter optical subassembly (TOSA) and a multi-channel receiver optical subassembly (ROSA).

Now turning to FIG. 1, there is an optical transceiver 100 consistent with embodiments of the present disclosure. In more detail, the optical transceiver 100 transmits and receives four (4) channels using four different channel wavelengths ($\lambda_1$, $\lambda_2$, $\lambda_3$, $\lambda_4$) and may be capable of transmission rates of at least about 10 Gbps per channel. In one example, the channel wavelengths $\lambda_1$, $\lambda_2$, $\lambda_3$, $\lambda_4$ may be 1270 nm, 1290 nm, 1080 nm, and 1330 nm, respectively. The optical transceiver 100 may also be capable of transmission distances of 2 km to at least about 10 km. The optical transceiver 100 may be used, for example, in internet data center applications or fiber to the home (FTTH) applications. In an embodiment, the optical transceiver 100 implements the specification SFF-8436 titled "QSFP+ 10 Gbs 4X PLUGGABLE TRANSCEIVER Rev 4.8" (hereinafter QSFP+), published on Oct. 31, 2013 by the Electronic Industries Alliance (EIA).

This embodiment of the optical transceiver 100 includes a multi-channel TOSA 110 for transmitting optical signals on different channel wavelengths, and a multi-channel ROSA 112 for receiving optical signals on different channel wavelengths. As shown, a transceiver housing 102 includes the multi-channel TOSA 110 and the multi-channel ROSA 112. A transmit connecting circuit 104 and a receive connecting circuit 108 provide electrical connections to the multi-channel TOSA 110 and the multi-channel ROSA 112, respectively, within the transceiver housing 102. The transmit connecting circuit 104 and the receive connecting circuit 108 may communicate with external systems via data bus 103. In some cases, data bus 103 is a 38-pin connector that comports with physical connector QSFP standards and data communication protocols.

In any event, the transmit connecting circuit 104 electrically couples to the electronic components in the multi-channel TOSA 110 (e.g., TO can laser packages), and the receive connecting circuit 108 electrically couples to the electronic components (e.g., the photodiode packages) in the multi-channel ROSA 112. The transmit connecting circuit 104 and the receive connecting circuit 108 include at least conductive paths to provide electrical connections, and may also include additional circuitry. The multi-channel TOSA 110 transmits and multiplexes multiple different channel wavelengths, and is coupled to an optical interface port 114. The optical interface port 114 may include an LC connector port, although other connector types are also within the scope of this disclosure. For example, the optical interface port 114 may comprise a multi-fiber push on (MPO) connector receptacle.

In cases where the optical interface port 114 comprises a duplex, or bi-directional, LC receptacle, the LC connector receptacle provides optical connections to the multi-channel TOSA 110, and provides optical connections to the multi-channel ROSA 112. The LC connector receptacle may be configured to receive and be coupled to a mating LC connector 116 such that transmit optical fiber 122 of the external fibers 124 optically couples to the multi-channel TOSA 110, and the receive optical fiber 117 of the external fibers 124 optically couples to the multi-channel ROSA 112.

The multi-channel TOSA 110 includes multiple TO can laser packages and optics for producing associated channel wavelengths, and couples the same into the transmit optical fiber 122. In particular, the lasers in the multi-channel TOSA 110 convert electrical data signals (TX_D1 to TX_D4) received via the transmit connecting circuit 104 into modulated optical signals transmitted over transmit optical fiber 122. The lasers may include, for example, distributed feedback (DFB) lasers with diffraction gratings. The multi-channel TOSA 110 may also include monitor photodiodes for monitoring the light emitted by the lasers. The multi-channel TOSA 110 may further include one or more temperature control devices, such as a resistive heater and/or a thermoelectric cooler (TEC), for controlling a temperature of the lasers, for example, to control or stabilize the laser wavelengths.

The multi-channel ROSA 112 includes multiple photodiode packages, and optics such as mirrors and filters for receiving a multiplexed optical signal and de-multiplexing the same into associated channel wavelengths. The multi-channel ROSA 112 can detect, amplify, and convert such optical signals received via the receive optical fiber 117, and can provide the converted optical signals as electrical data signals (RX_D1 to RX_D4) that are output via the receive connecting circuit 108. In some cases, the photodiode packages can include integrated transimpedance amplifiers (TIAs).

This embodiment of the optical transceiver 100 includes 4 channels and may be configured for coarse wavelength division multiplexing (CWDM), although other numbers of channels are possible.

Figure 2:
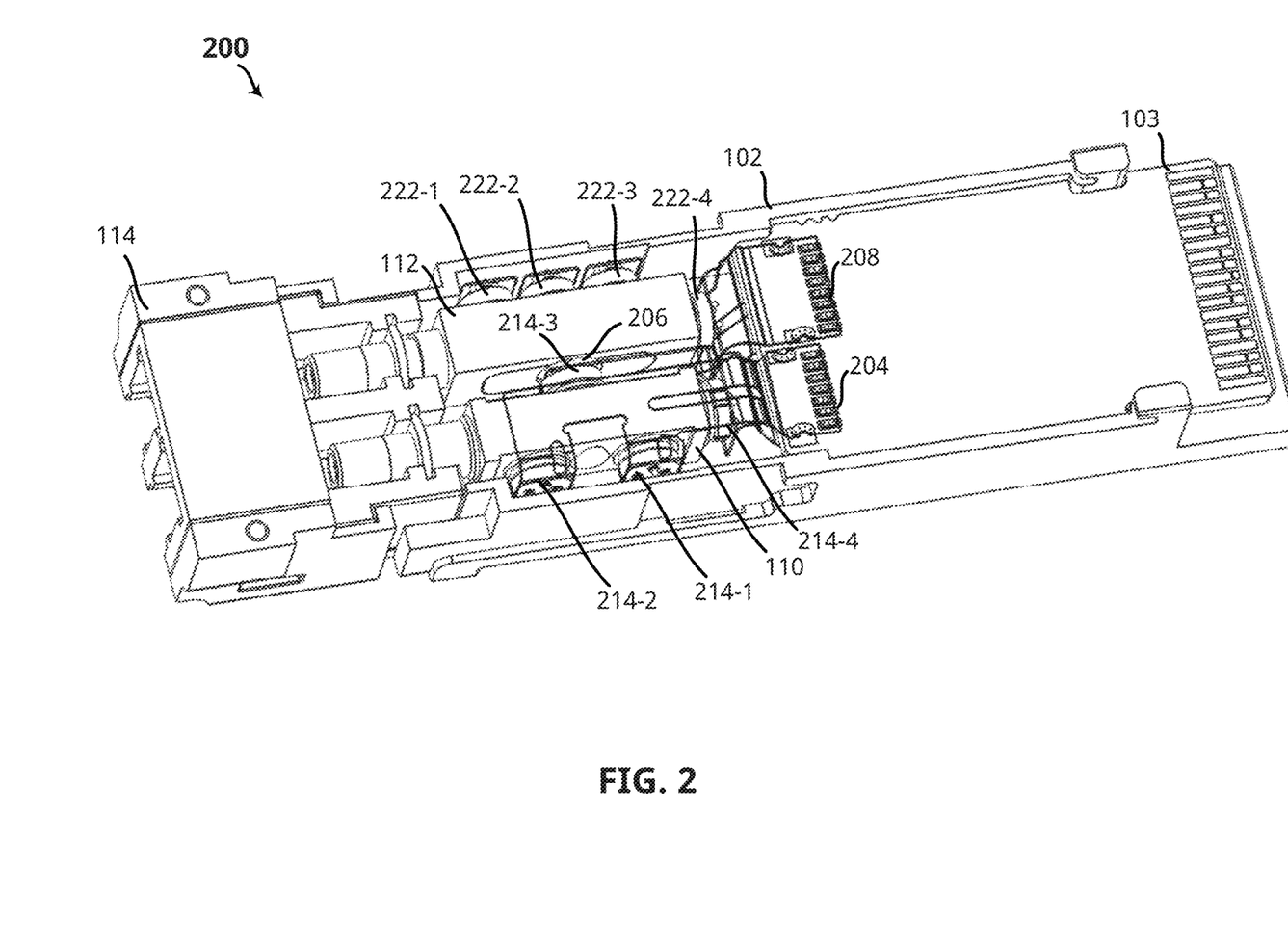
FIG. 2 is a perspective view of an example small form-factor (SFF) pluggable transceiver with a multi-channel TOSA and a multi-channel ROSA, in accordance with an embodiment of the present disclosure.

Referring to FIG. 2, an example small form-factor (SFF) pluggable optical transceiver 200 with a multi-channel TOSA and a multi-channel ROSA is shown. The embodiment shown in FIG. 2 is one example of the optical transceiver 100 of FIG. 1 implemented in a small form-factor. For example, the optical transceiver 200 may implement the QSFP+ specification. As shown, the optical transceiver 200 includes a transceiver housing 102, a multi-channel TOSA 110 in one region of the transceiver housing 102, and a multi-channel ROSA 112 located in another region of the transceiver housing 102. The multi-channel TOSA 110 electrically couples to transmit flexible printed circuits (FPCs) 204 and couples to the optical interface port 114 at an end of the transceiver housing 102. The multi-channel ROSA 112 electrically couples to a receive FPC 208, and couples to the optical interface port 114 at the end of the transceiver housing 102.

The multi-channel TOSA 110 includes TO can laser packages 214-1 to 214-4, with each containing optical components such as a laser diode. The TO can laser packages 214-1 to 214-4 may provide, for example, output power from 1.85 mW to 2 W, although other output power is within the scope of this disclosure. The TO can laser packages 214-1 to 214-4 may provide a broad spectrum of channel wavelengths, or may be configured to provide a relatively narrow spectrum of channel wavelengths such as a single channel wavelength. In some cases, the TO can laser packages 214-1 to 214-4 provide center wavelengths 375 nm to 1650 nm, for example. In an embodiment, the TO can laser packages 214-1 to 214-4 are Ø3.8 mm, Ø5.6 mm, or Ø9 mm TO cans, although other configurations are also within the scope of this disclosure. For instance, the TO can laser packages can include Ø9.5 mm and TO-46 cans.

One particular example of a multi-channel TOSA particularly well suited for use in the optical transceiver 200 is discussed in greater detail in the co-pending U.S. application Ser. No. 14/837,993 titled "Multi-Channel Transmitter Optical Subassembly (TOSA) With Opposing Placement of Transistor Outline Can Laser Packages" filed on Aug. 27, 2015. Such a multi-channel TOSA departs from other TOSA approaches by providing staggered TO can laser packages positioned on opposite sidewalls. The multi-channel TOSA 110 of FIG. 2 illustrates one such example of a staggered and opposing TO can laser package configuration. The staggered and opposing arrangement can increase space between adjacent TO can laser packages, which can simplify laser welding processes, reduce error, and increase yield.

The multi-channel ROSA 112 includes photodiode packages 222-1 to 222-4, with each containing optical components such as a photodiode and TIA, for example. In some cases, the photodiodes can provide about −13 dBm sensitivity, or less, for each associated channel wavelength. In an embodiment, the photodiode packages are TO-46 packages, although other package types are also within the scope of this disclosure.

Figure 3:
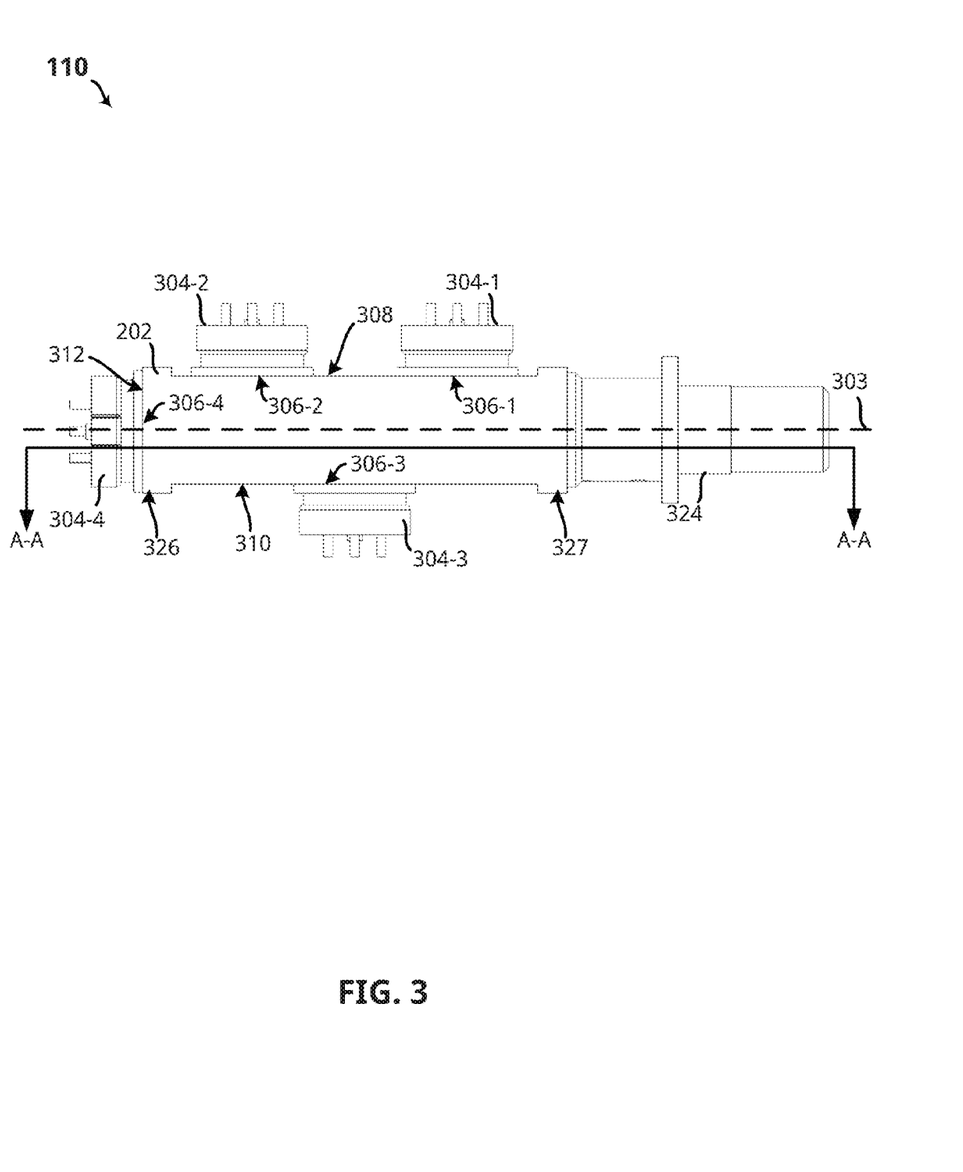
FIG. 3 is a perspective view of an embodiment of the multi-channel TOSA for use in the optical transceiver shown in FIG. 2.

Referring to FIG. 3, one embodiment of a multi-channel TOSA 110 for use in the optical transceiver module shown in FIG. 2 is shown in greater detail. As shown, the multi-channel TOSA 110 includes a housing 202 with first and second sidewalls 308 and 310, respectively, positioned on opposite sides of the housing 202 and extending generally in parallel along a first major axis 303 from a first end 326 to a second end 327, and forming a compartment defined by an inner surface within the housing 202. The housing 202 can further include an optical coupling receptacle 324 configured to optically couple an associated transmit fiber such as transmit optical fiber 122 to the multi-channel TOSA 110.

As shown, the multi-channel TOSA 302 includes first and second TO can laser packages 304-1 and 304-2 fixedly attached to the first and second sidewall openings 306-1 and 306-2 of the first sidewall 308, respectively, and a third TO can laser package 304-3 fixedly attached to the third sidewall opening 306-3 opposing the first and second TO can laser packages 304-1 and 304-2. The housing 202 further includes a third sidewall 312 at the first end 326 and adjoining the first and second sidewalls 308 and 310, the third sidewall 312 including a fourth sidewall opening 306-4 and a fourth TO can laser package 304-4 fixedly attached thereto.

Figure 4A:
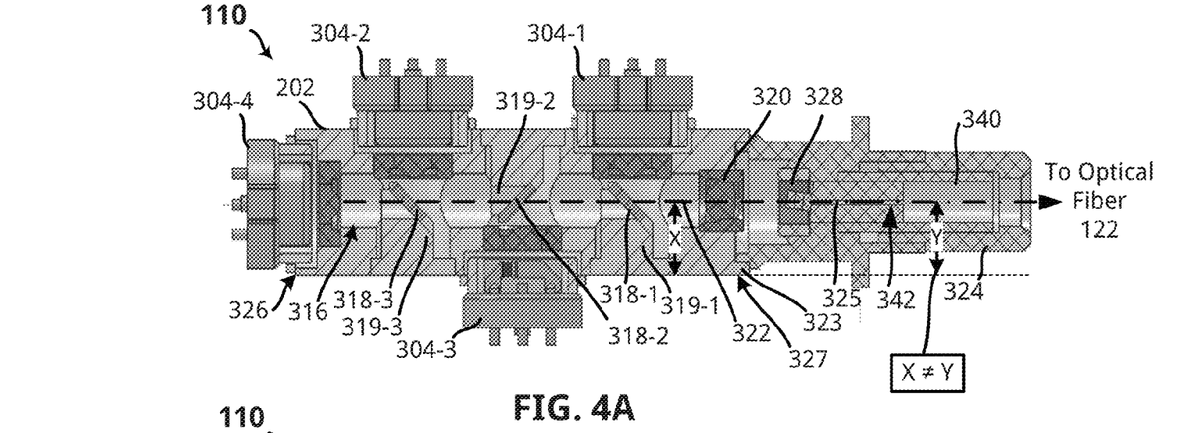
FIG. 4A is a cross-sectional view of the multi-channel TOSA of FIG. 3 taken along the line A-A, in accordance with an embodiment of the present disclosure.
Figure 4B:
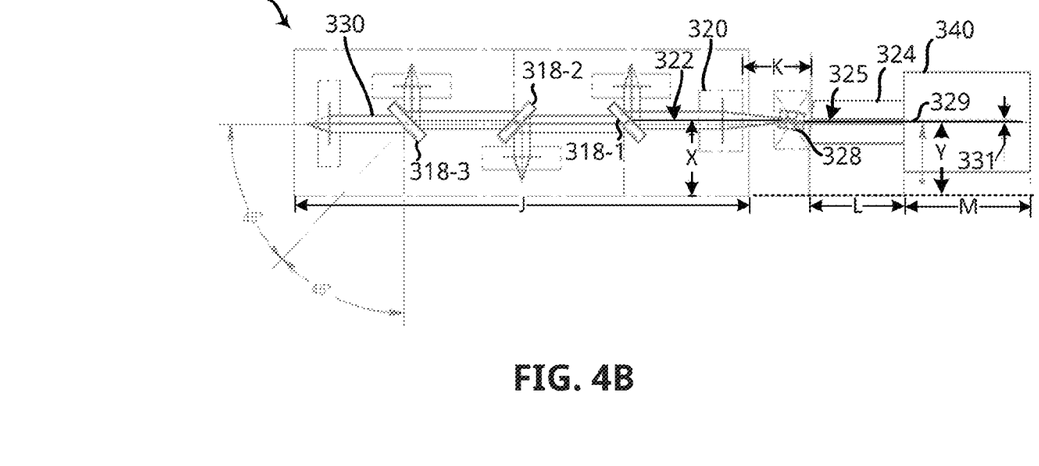
FIG. 4B is a plan view of the multi-channel TOSA of FIG. 3 and illustrates internal optical components along a light path that extends laterally to an off-center fiber within an optical coupling receptacle of the multi-channel TOSA, in accordance with an embodiment of the present disclosure.

Referring now to FIG. 4A, with additional reference to FIG. 4B, a cross-sectional view of the multi-channel TOSA 110 of FIG. 3 taken along line A-A is shown. As shown, the housing 202 also forms a compartment 316, or internal cavity that defines a light path 330 (FIG. 4B) that extends laterally generally along a center line 322. Light may travel along the light path 330 which extends through filters 318-1 to 318-3 before encountering focus lens 320. After encountering focus lens 320, light is output as a focused beam into the optical coupling receptacle 324. Within the optical coupling receptacle 324, an optical isolator 328 receives the focused beam and can optically couple the same into fiber 325. As previously discussed, the optical isolator 328 can eliminate or otherwise mitigate backreflection. The optical isolator 328 may be angled relative to the center line 322 by a predetermined amount to further assist in preventing backreflection. For example, the optical isolator 328 may be angled 6 to 8 degrees relative to the center line 322. As shown, the optical isolator 328 includes 3 isolator chips stacked in series. Other numbers and configurations of isolator chips will be apparent in light of this disclosure.

As shown, the fiber 325 extends generally coaxial with the compartment 316 of the multi-channel TOSA housing 202. To receive the fiber 325, the multi-channel TOSA housing 202 includes a cavity 342 having a diameter suitable for receiving a portion of fiber 325. For example, the cavity may comprise a rounded bore having a diameter between 8 and 70 microns, depending on a desired fiber type. Likewise, a ferrule receiving region 340 may define a bore having a diameter suitable to receive and hold a ferrule associated with the length of fiber.

Although a center line of the fiber 325 appears to generally align with the center line 322 of the compartment 316, this is not necessarily the case as the center line of the fiber 325 is offset relative to the center line 322 by a number of microns, as discussed in greater detail below. The offset between the center line of fiber 325 and the center line 322 may be a range between 10 to 100 microns, which is better illustrated in FIG. 4C. In any event, distance X from an outer surface of the housing 202 to the center line 322 is different from that of distance Y, with distance Y being measured from a line extending from the outer surface of the housing 202 to the center line of the fiber 325. This arrangement allows a physical position of the optical coupling receptacle 324 to compensate for the beam displacement that may be introduced by the optical isolator 328.

As shown, the filters 318-1 to 318-3 are positioned on filter holders 319-1 to 319-3, respectively. An optical coupling receptacle 324 extends from the second end 327 for optically coupling the associated channel wavelengths of TO can laser packages 304-1 to 304-4 to the transmit optical fiber 122. Thus the filters 318-1 to 318-3, the focus lens 320, and the optical coupling receptacle 324 are generally aligned or otherwise positioned along a longitudinal axis provided by the light path 330. This combination of optics may be accurately described as multiplexing optics and can provide coarse wavelength division multiplexing (CWDM) in an optical signal, for example.

Referring now to FIG. 4B, with additional reference to FIG. 4A, a schematic view of the multi-channel TOSA 110 provides further detail regarding the off-center position of fiber 325 relative to the light path 330, with light path 330 generally following the center line 322. The long axis J of the housing 202 may include a length of approximately 7 mm. The multi-channel TOSA 110 may further include a length K along its long axis of approximately 2.16 mm between an output side of the focus lens 230 and the output side of the optical isolator 328. In addition, the multi-channel TOSA 110 may further include a length L along its long axis of approximately 3 mm between the output side of the optical isolator 328 and a ferrule receiving region 340 of the optical coupling receptacle. The ferrule receiving region 340 may include a length of M being approximately 4 mm. The provided measurements are not intended to be limiting and other lengths of the multi-channel TOSA are within the scope of this disclosure.

As shown, a center line 322 of the light path 330 extending from the filter 318-1 plots the center line of the light path 330 which a light beam generally follows prior to encountering the focus lens 320. From there, the light beam also includes a center line defined by center line 322, but becomes a focused light beam by virtue of passing through focus lens 320. The focused light beam then encounters optical isolator 328. As previously discussed, the optical isolator introduces beam displacement thus causing the focused light beam to have a center line that generally follows the center line 329 of the optical coupling receptacle 324, and more importantly, a center line of the fiber 325. Thus the offset distance 331 representing the offset of the center line 329 of the optical coupling receptacle relative to the center line. The offset distance 331 may be chosen based on the known amount of beam displacement introduced by the optical isolator 328, for example. In addition, the offset distance may also be based on the angle at which the optical isolator 328 is disposed within the optical coupling receptacle 324. In any event, the offset can be calculated based in part on the pre-determined amount of beam displacement introduced by the optical isolator 328 and by its particular orientation/angle relative to the center line 322.

Figure 4C:
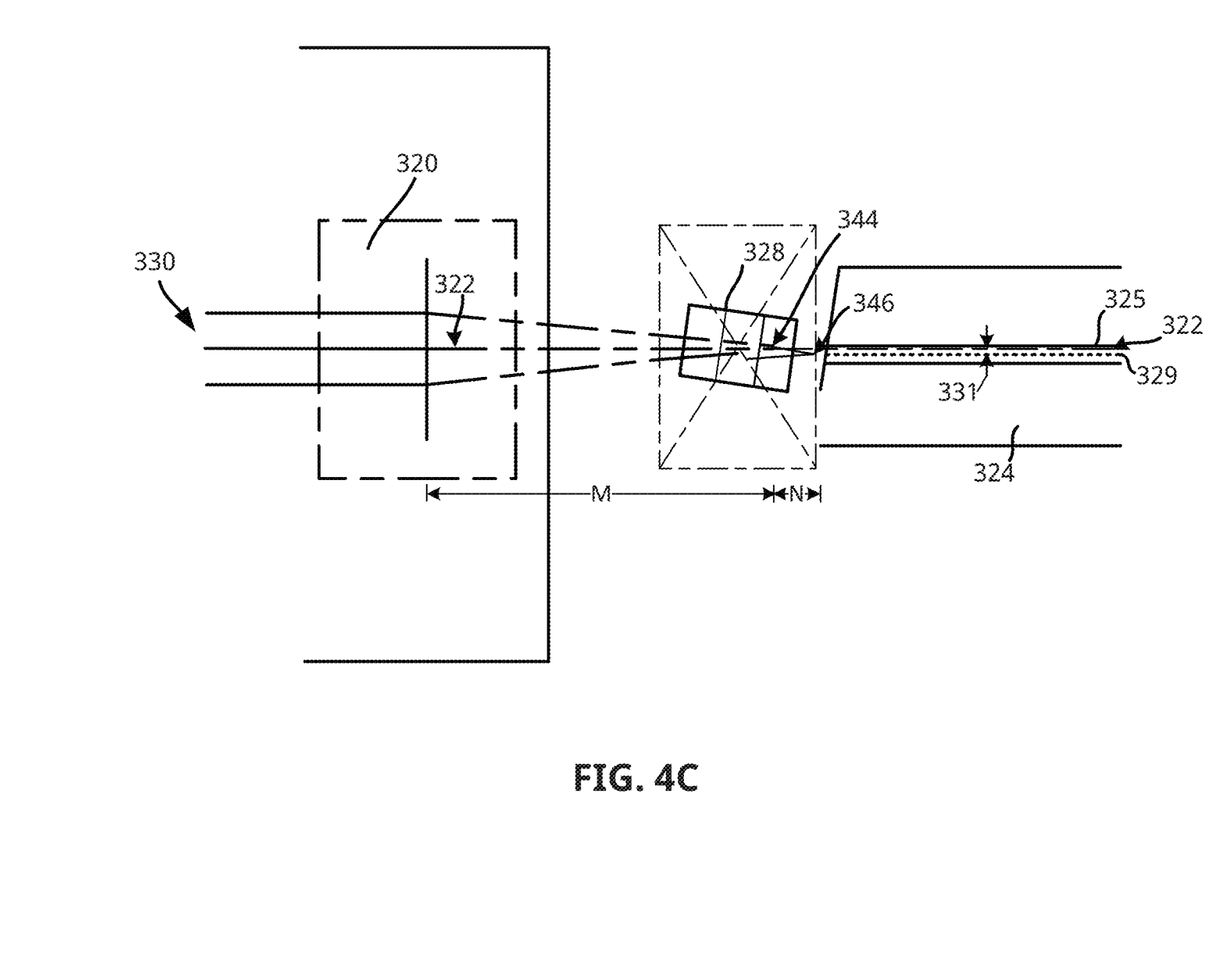
FIG. 4C shows another plan view of the multi-channel TOSA of FIG. 3, and illustrates a fiber having a center line offset relative to the center of a focus lens within the multi-channel TOSA, in accordance with an embodiment of the present disclosure.

Referring now to FIG. 4C, with additional reference to FIG. 4A-B, another schematic view of the multi-channel TOSA 110 provides further detail regarding the off-center position of the fiber 325 relative to center line 322. The introduction of beam displacement by the optical illustrator may be better understood by way of illustration. Consider that without the optical isolator 328, the focal point 344 extending from the focus lens 320 has a length M. This means that the fiber 325 could be positioned adjacent thereto and receive a focused light beam to launch the same into the associated transmit fiber 122.

However, the presence of the optical isolator causes the focal length of a light beam following light path 330 to extend laterally to the offset focal point generally shown at 346. The offset distance between focal point 344 and offset focal point 346 is shown as length N, which may be accurately described as a lateral or X-axis offset. In one particular example, the length N is about 0.33 mm. In addition, the displacement introduced by the optical isolator causes the offset focal point 346 to offset a distance generally equal to the offset 331, which may be accurately described as a vertical or Y-axis offset. In one particular example, the offset 331 is about 50 microns. Thus to ensure optimal or otherwise suitable optical power provided by multi-channel TOSA, the optical signal propagated along the center line 329 is aligned with the offset focal point 46 such that a light beam propagated therefrom is launched substantially into the center of the fiber 325.

Figure 5A:
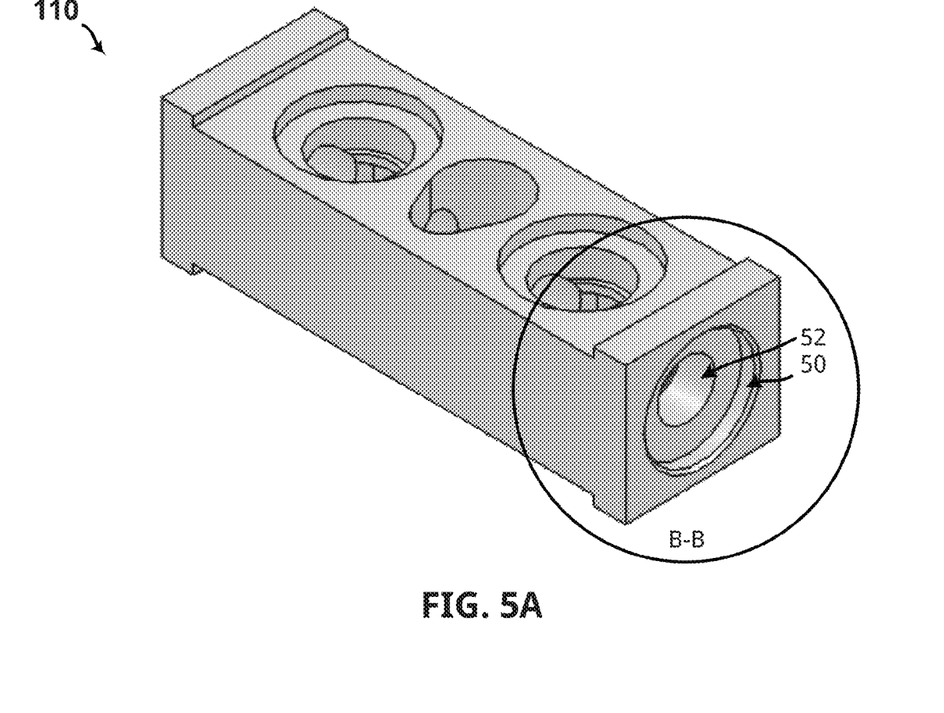
FIG. 5A shows a perspective view of the multi-channel TOSA of FIG. 3, in accordance with an embodiment of the present disclosure.

Now referring to FIG. 5A, a perspective view of the multi-channel TOSA 110 is shown, in accordance with an embodiment. As shown, the multi-channel TOSA housing 102 includes an end with a first sidewall opening 50 configured to fixedly attach an optical coupling receptacle, and a second sidewall opening 52 configured to mount a focus lens. As discussed below with regard to FIG. 4B, the offset between a center line of the fiber 325 (FIG. 4B) and the center of the focus lens may be provided by, for example, attaching the optical coupling receptacle to the multi-channel TOSA housing at a position offset from the center of the focus lens. To this end, the second sidewall opening 52 may be formed off-center from the first sidewall opening 50 such that a center point of the second sidewall opening 52 is offset along a Y axis from a center point of the first sidewall opening, as shown in greater detail in FIG. 5B, and discussed below. When mounted to the first sidewall opening 50, the offset of the off-center optical coupling receptacle may be 10 to 100 microns relative to the center of the focus lens. Other offsets will be apparent in light of this disclosure and may be based on, for example, isolator type, a particular number of isolators employed, isolator thickness, and other isolator-specific factors.

Figure 5B:
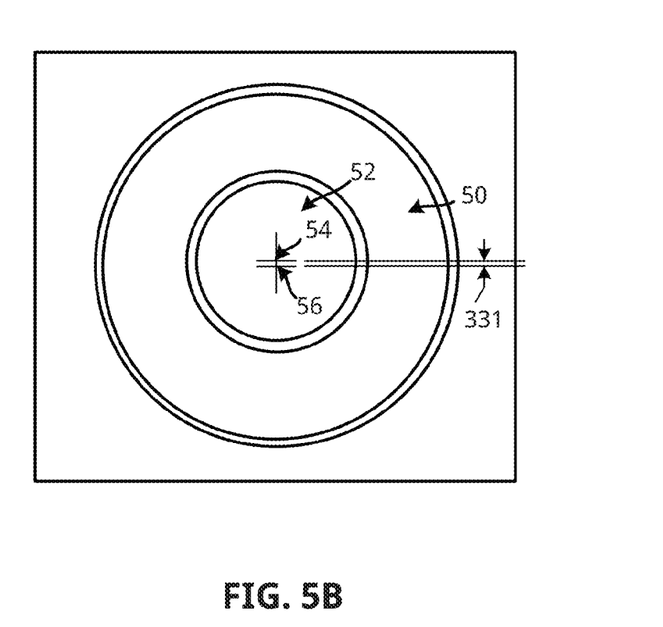
FIG. 5B shows a cross-sectional view of the multi-channel TOSA of FIG. 5A taken along the line B-B.

Referring now to FIG. 5B, a cross-sectional view taken along the line B-B of FIG. 5A is shown, in accordance with an embodiment of the present disclosure. As shown, the center point 54 of the second sidewall opening 52 is offset from the center point 56 of the first sidewall opening 50. The offset is shown as offset distance 331. Thus, when the optical coupling receptacle 324 is fixedly attached to the first sidewall opening 50, the fiber 325 includes a center line generally extending from point 56, which is offset by offset distance 331 from the center point 56, or more precisely, from the center of the focus lens 320.

Returning to FIGS. 4A and 4B, one example methodology of multiplexing multiple different channel wavelengths using the multi-channel TOSA 110 will now be discussed. In use, the filters 318-1 to 318-3, and other optics associated with the TO can laser packages 304-1 to 304-4 such as collimating lenses, mirrors can provide wavelength-dependent transmission and reflectivity such that each respective channel wavelength associated with TO can laser packages 304-1 to 304-4 is optically coupled to light path 330, and more precisely, multiplexed and launched into the transmit optical fiber 122 via fiber 325. For example, the filter 318-3 may be configured to pass channel wavelengths less than 1290 nm, namely channel wavelength $\lambda_1$ associated with CAN laser package 304-4, and reflect channel wavelengths greater than or equal to 1290 nm, namely channel wavelength $\lambda_2$ associated with TO can laser package 304-2.

In a similar manner, the filter 318-2 may be configured to pass channel wavelengths of less than 1310 nm (e.g., channel wavelengths $\lambda_1$ and $\lambda_2$) and reflect channel wavelengths equal to or greater than 1310 nm, namely channel wavelength $\lambda_3$ associated with TO can laser package 304-3. Filter 318-1 may be configured to pass channel wavelengths of less than 1330 nm (e.g., channel wavelengths $\lambda_1$, $\lambda_2$ and $\lambda_3$) and reflect channel wavelengths equal to or greater than 1330 nm, namely channel wavelength $\lambda_4$ associated with TO can laser package 304-1. Thus an optical signal launched into transmit optical fiber 122 can include multiple different channel wavelengths $\lambda_1$, $\lambda_2$, $\lambda_3$ and $\lambda_4$. This arrangement may be accurately described as an integrated optical multiplexer, or an integrated multi-stage optical multiplexer with each stage being provided, in part, by a respective one of the filters 318-1 to 318-3.

It should be appreciated in light of this disclosure that the use of the TOSA 110 is not necessarily limited to a 4 channel configuration.

Further Example Embodiments

In one aspect, a multi-channel transmitter optical subassembly (TOSA) including a plurality of lasers is disclosed. The TOSA may comprise a housing including a plurality of sidewalls, the plurality of sidewalls forming a compartment defined by an inner surface therein, the compartment including a light path, the light path being optically coupled to each of the plurality of lasers and extending laterally from a first end to a second end of the housing along a first major axis, a focus lens disposed at the second end of the housing configured to receive at least a portion of light emitted by the plurality of lasers via the light path and to output a focused light beam, and an optical coupling receptacle fixedly attached to the second end of the housing and configured to couple the light path to a fiber, the optical coupling receptacle including an optical isolator configured to receive the focused light beam and launch the focused light beam in a forward direction into the fiber while reducing backreflection, wherein a center line of the fiber is offset from a center of the focus lens, and wherein the offset passively compensates for beam displacement introduced by the optical isolator such that the focused light beam is launched generally into a center of the fiber.

In one aspect, the offset between the center line of the fiber and the center of the focus lens may be about 50 microns.

In one aspect, the offset between the center line of the fiber and the center of the focus lens may be at least 10 microns.

In one aspect, the offset between the center line of the fiber and the center of the focus lens may be based at least in part on a physical position of the optical coupling receptacle relative to the position of the focus lens.

In one aspect, the optical isolator may be angled in the optical coupling receptacle at about 8 degrees relative to a center line of the focused light beam.

In one aspect, the plurality of lasers comprise TO can laser packages.

In one aspect, the multi-channel TOSA may further include filters aligned with the TO can laser packages to pass and reflect laser light at associated channel wavelengths.

In one aspect, the optical coupling receptacle is configured to optically couple a signal having multiple different channel wavelengths to a transmit optical fiber.

In accordance with another aspect, an optical transceiver module is disclosed. The optical transceiver module may include a transceiver housing, a multi-channel transmitter optical subassembly (TOSA) having a plurality of transistor outline (TO) can laser packages fixedly attached thereto and located in the transceiver housing for transmitting optical signals at different channel wavelengths, the TOSA comprising, a housing including a plurality of sidewalls, the plurality of sidewalls forming a compartment defined by an inner surface therein, the compartment including a light path, the light path being optically coupled to each of the plurality of TO can laser packages and extending laterally from a first end to a second end of the housing along a first major axis, a focus lens disposed at the second end of the housing configured to receive at least a portion of light emitted by the plurality of lasers via the light path and to output a focused light beam, and an optical coupling receptacle fixedly attached to the second end of the housing and configured to couple the light path to a fiber, the optical coupling receptacle including an optical isolator configured to receive the focused light beam and launch the focused light beam in a forward direction into the fiber while reducing backreflection, wherein a center line of the fiber is offset from a center of the focus lens, and wherein the offset passively compensates for beam displacement introduced by the optical isolator such that the focused light beam is launched generally into a center of the fiber, and a multi-channel receiver optical assembly (ROSA) located in the transceiver housing for receiving optical signals at different channel wavelengths.

In one aspect, the offset between the center line of the fiber and the center of the focus lens may be about 50 microns.

In one aspect, the offset between the center line of the fiber and the center of the focus lens may be at least 10 microns.

In one aspect, the offset between the center line of the fiber and the center of the focus lens of the may be based at least in part on a physical position of the optical coupling receptacle relative to the focus lens.

In one aspect, the optical isolator may be angled at about 8 degrees relative to a center line of the focused light beam.

In one aspect, the plurality of TO can laser packages may comprise at least four TO can laser packages.

In one aspect, the multi-channel TOSA may include integrated multiplexing optics configured to launch an optical signal into a transmit fiber, the optical signal having multiple different channel wavelengths. In this aspect, the integrated multiplexing optics may provide course wavelength division multiplexing (CWDM). Further in this aspect, the integrated multiplexing optics may include filters aligned with respective ones of the TO can laser packages to pass and reflect laser light at associated channel wavelengths.

In one aspect, the optical coupling receptacle may be fixedly attached to a sidewall opening at an end of the housing of the multi-channel TOSA.

In one aspect, the optical isolator may comprise a plurality of isolator chips in series.

In one aspect, the optical transceiver may be a Quad Small Form-factor Pluggable (QSFP) transceiver module and the multi-channel TOSA is configured to transmit at four different channel wavelengths at transmission rates of at least about 10 Gbps per channel.

While the principles of the disclosure have been described herein, it is to be understood by those skilled in the art that this description is made only by way of example and not as a limitation as to the scope of the disclosure. Other embodiments are contemplated within the scope of the present disclosure in addition to the exemplary embodiments shown and described herein. Modifications and substitutions by one of ordinary skill in the art are considered to be within the scope of the present disclosure, which is not to be limited except by the following claims.

What is claimed is:

1. A multi-channel transmitter optical subassembly (TOSA), the TOSA comprising:
a plurality of lasers;
a housing including a plurality of sidewalls, the plurality of sidewalls forming a compartment defined by an inner surface therein, the compartment including a light path, the light path being optically coupled to each of the plurality of lasers and extending laterally from a first end to a second end of the housing along a first major axis;
a focus lens disposed at the second end of the housing configured to receive at least a portion of light emitted by the plurality of lasers via the light path and to output a focused light beam; and
an optical coupling receptacle coupled to the second end of the housing, the optical coupling receptacle having a cavity to receive at least a portion of a fiber and couple the light path to the fiber and an optical isolator disposed within the cavity adjacent the housing to receive the focused light beam and launch the focused light beam in a forward direction into the fiber while reducing backreflection,
wherein a center line of the fiber within the cavity of the optical coupling receptacle is offset from a center of the focus lens, and wherein the offset passively compensates for beam displacement introduced by the optical isolator such that the focused light beam is launched substantially into a center of the fiber.

2. The multi-channel TOSA of claim 1, wherein the offset between the center line of the fiber and the center of the focus lens is 50 microns.

3. The multi-channel TOSA of claim 1, wherein the offset between the center line of the fiber and the center of the focus lens is at least 10 microns.

4. The multi-channel TOSA of claim 1, wherein the optical coupling receptacle further includes a ferrule receiving portion.

5. The multi-channel TOSA of claim 1, wherein the optical isolator is angled in the optical coupling receptacle at 6 to 8 degrees relative to a center line of the focused light beam.

6. The multi-channel TOSA of claim 1, wherein the plurality of lasers comprise TO can laser packages.

7. The multi-channel TOSA of claim 6, further comprising filters aligned with the TO can laser packages to pass and reflect laser light at associated channel wavelengths.

8. The multi-channel TOSA of claim 1, wherein the optical coupling receptacle extends along the major axis of the housing.

9. An optical transceiver module comprising:
a transceiver housing;
a multi-channel transmitter optical subassembly (TOSA) having a plurality of transistor outline (TO) can laser packages coupled thereto and located in the transceiver housing for transmitting optical signals at different channel wavelengths, the TOSA comprising:
a housing including a plurality of sidewalls, the plurality of sidewalls forming a compartment defined by an inner surface therein, the compartment including a light path, the light path being optically coupled to each of the plurality of TO can laser packages and extending laterally from a first end to a second end of the housing along a first major axis;
a focus lens disposed at the second end of the housing configured to receive at least a portion of light emitted by the plurality of TO can laser packages via the light path and to output a focused light beam; and
an optical coupling receptacle coupled to the second end of the housing, the optical coupling receptacle having a cavity to receive at least a portion of a fiber and couple the light path to the fiber and an optical isolator disposed within the cavity adjacent the housing to receive the focused light beam and launch the focused light beam in a forward direction into the fiber while reducing backreflection,
wherein a center line of the fiber within the cavity of the optical coupling receptacle is offset from a center of the focus lens, and wherein the offset passively compensates for beam displacement introduced by the optical isolator such that the focused light beam is launched substantially into a center of the fiber;
a multi-channel receiver optical assembly (ROSA) located in the transceiver housing for receiving optical signals at different channel wavelengths.

10. The optical transceiver module of claim 9, wherein the offset between the center line of the fiber and the center of the focus lens is 50 microns.

11. The optical transceiver module of claim 9, wherein the offset between the center line of the fiber and the center of the focus lens is at least 10 microns.

12. The optical transceiver module of claim 9, wherein the optical coupling receptacle further includes a ferrule receiving portion.

13. The optical transceiver module of claim 12, wherein the optical isolator is angled at 6-8 degrees relative to a center line of the focused light beam.

14. The optical transceiver module of claim 9, wherein the plurality of TO can laser packages comprise at least four TO can laser packages.

15. The optical transceiver module of claim 9, wherein the optical coupling receptacle includes a ferrule receiving portion.

16. The optical transceiver module of claim 9, wherein the multi-channel TOSA provides course wavelength division multiplexing (CWDM) signaling.

17. The optical transceiver module of claim 9, wherein the multi-channel TOSA includes filters aligned with the TO can laser packages to pass and reflect laser light at associated channel wavelengths.

18. The optical transceiver module of claim 9, wherein the optical coupling receptacle is coupled to a sidewall opening at an end of the housing of the multi-channel TOSA.

19. The optical transceiver module of claim 9, wherein the optical isolator comprises a plurality of isolator chips in series.

20. The optical transceiver module of claim 9, wherein the optical transceiver is a Quad Small Form-factor Pluggable (QSFP) transceiver module and the multi-channel TOSA is configured to transmit at four different channel wavelengths at transmission rates of at least about 10 Gbps per channel.

\* \* \* \* \*